METHOD FOR APPLYING PATTERNS TO BASE MATERIAL

Filed Sept. 30, 1955 2 Sheets-Sheet 1

INVENTORS
PAUL L. ANDERSON
JOHN A. ZAGUSTA &
NORMAN L. GREENMAN
BY
Pennie, Edmonds, Morton, Barrows & Taylor
ATTORNEYS

METHOD FOR APPLYING PATTERNS TO BASE MATERIAL

Filed Sept. 30, 1955 2 Sheets-Sheet 2

INVENTORS
PAUL L. ANDERSON,
JOHN A. ZAGUSTA &
NORMAN L. GREENMAN
BY
Pennie, Edmonds, Morton, Barrows & Taylor
ATTORNEYS United States Patent Office 2,971,249

Patented Feb. 14, 1961

2,971,249

METHOD FOR APPLYING PATTERNS TO BASE MATERIAL

Paul L. Anderson, Vernon, Conn., John A. Zagusta, Jackson Heights, N.Y., and Norman L. Greenman, Danielson, Conn., assignors, by mesne assignments, to Rogers Corporation, Rogers, Conn., a corporation of Massachusetts Filed Sept. 30, 1955, Ser. No. 537,792

7 Claims. (Cl. 29—155.5)

This invention relates to a process for applying patterns from sheet material to base or carrier material and more particularly to a process for applying die-blanked patterns to sheets of base or carrier material.

Broadly, our invention provides a method for the application of a pattern to a base material in which the pattern is die-blanked from a sheet material of the proper thickness. The die-blanked pattern is then applied to the base material making use of an appropriate adhesive. The pattern base combination or unit thus formed may then be heat molded if desired.

The method of our invention may be used for the purpose of applying a pattern to a base material for decorative purposes, for example, applying inlays to table tops, or for industrial purposes, as, for example, in making printed electric circuits where the pattern is an electrically conductive or resistive material and the base material is an electrically insulating material. The base material may be leather, wood, metal or a plastic, either thermosetting or thermoplastic.

The method of our invention has particularly advantageous application in the manufacture of printed wiring circuits where the patterns are in close registry to each other. Many of the conventional printed circuit manufacturing processes incorporate steps, for example, immersion in aqueous, alkaline, or acidic solutions which may either diminish or completely destroy some of the desirable features of the printed circuitry.

The process of this invention when used for the manufacture of printed circuits comprises the steps of die-blanking a circuit pattern out of conductive or resistive material and applying the preformed circuit pattern onto an insulating base making use of an appropriate adhesive for adherence. Pilot or mounting holes may then be pierced into the pattern base combination. The pierced pattern base combination thereafter may be molded in an appropriate mold should molding be required. The molding process, when it is used, is advantageously performed by the application of heat, pressure, or both to the pattern base combination. In addition, in order to accurately dimension the mounting holes, the mold may be provided with sizing pins. When the pattern base combination is to be molded, moldable base material is used so that the molding step molds the pattern base combination to a final form and state. If a base material is used which is already in its final form and state, then the molding step may be omitted.

The process of this invention also contemplates the step of adhering the pattern to the base. An appropriate adhesive should be chosen based upon the type of base and pattern materials to be used and whether or not the pattern base combination is to be finally molded. When using a moldable base material and the pattern base combination is to be heat molded, a heat sensitive adhesive is advantageously used. A pressure sensitive adhesive may be advantageously used in certain cases, for example, when a pressure molding step is used. Solvent adhesives may also be used with appropriate materials. The choice of adhesive will depend upon the materials used and final product desired.

The manufacture of the printed circuit using the process of our invention can be most economically effected by die-blanking a circuit pattern out of a strip of conductive or resistive material, applying an appropriate adhesive between the pattern and the base material, adhering the conductive or resistive circuit pattern onto the base material, indexing the combination, and punching out mounting holes and stamping the pattern base combination in accordance with the indexing. If a moldable base material has been used, the pattern base combination preform may be fitted into a mold having sizing pins adapted to fit into the punched mounting holes and the preform molded.

For the purpose of describing our invention, we will use as an illustration, the manufacture of printed wiring circuits. That specific embodiment of the invention will now be described in detail in accordance with the accompanying drawings, in which.

Figure 1:
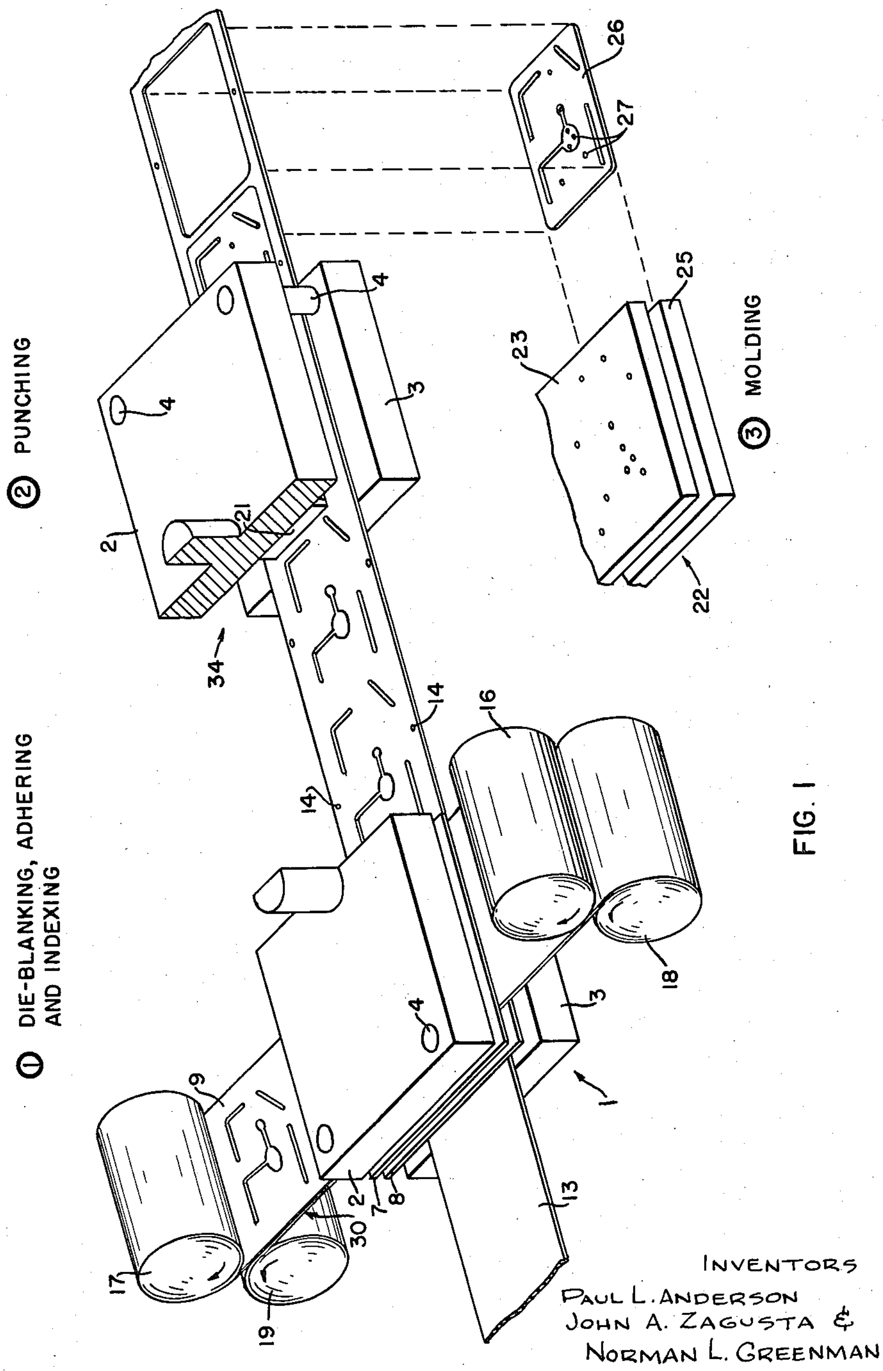
Fig. 1 is a flow sheet of a die-blanked printed circuit manufacturing process.
Figure 2:
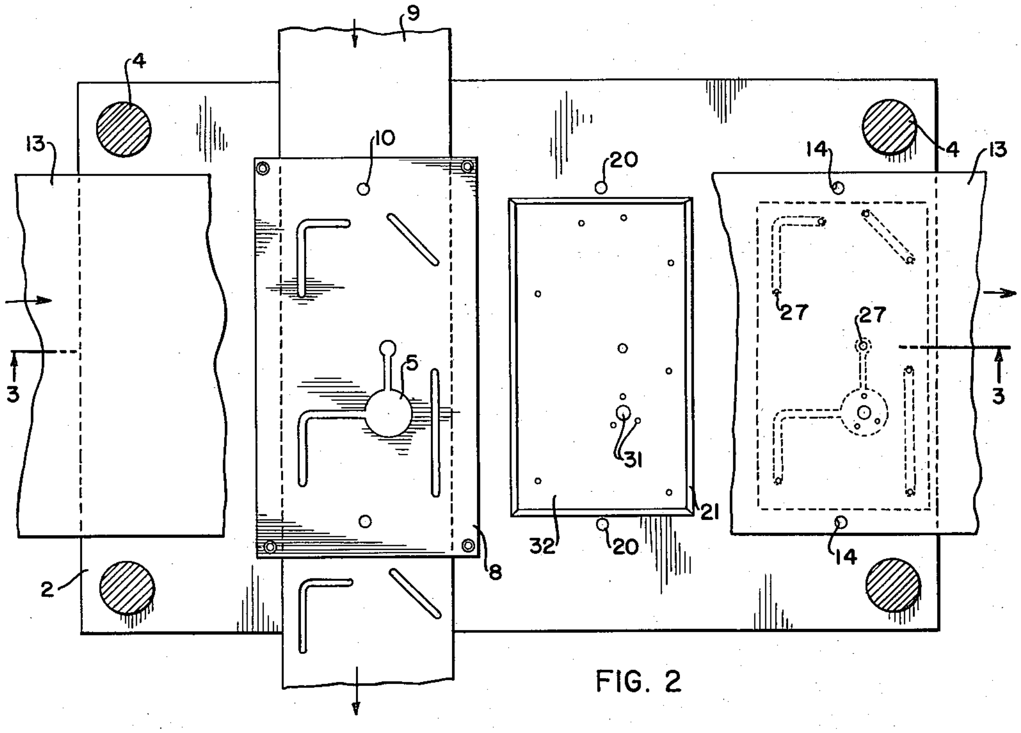
Fig. 2 is a plan sectional view of the male and female dies used in the manufacturing process taken along line 2—2 of Fig. 3.
Figure 3:
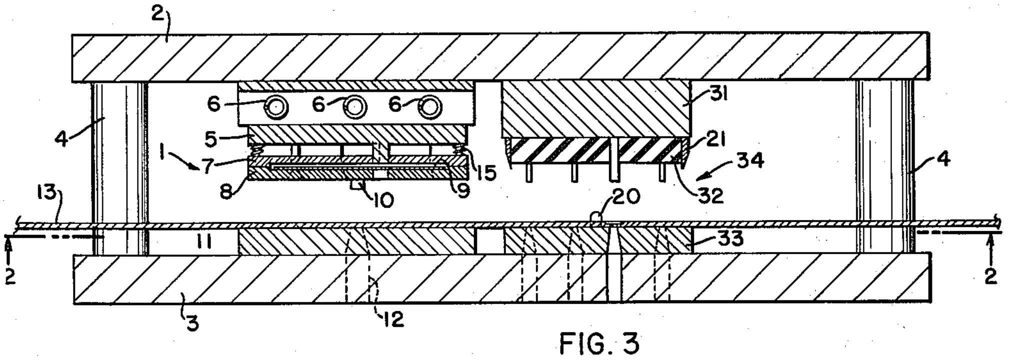
Fig. 3 is an elevation sectional view of the apparatus of Fig. 2 taken along line 3—3 of Fig. 2.

Referring to Fig. 1, the manufacturing process is divided into three steps: (1) die-blanking, adhering and indexing; (2) punching; and (3) molding. Step 1 takes place in press 1 illustrated in detail in Figs. 2 and 3. The press comprises anvils 2 and 3 separated by posts 4 which are arranged so that anvil 2 may be pressed toward anvil 3. A male circuit pattern die 5 having heating coils 6 embedded therein is attached to anvil 2. A mating female die 8 is attached to a metal stripper 7, the female die and stripper being so constructed that a space is formed between the two for the insertion of the conductive material 9. The female die and stripper combination is attached to male die 5 through springs 15. The female die 8 has attached indexing pins 10. Anvil 3 has an attached indexing female die 11, holes 12 being adapted to mate with indexing pins 10. A strip of base material 13 is inserted into the die between female die 8 and indexing die 11.

In the operation of the die-blanking press, the anvils 2 and 3 are pressed together. Female die 8 proceeds toward the base strip 13 until pins 10 punch indexing holes 14 into it. The punched out waste material is cleared through hole 12 which extends through anvil 3. The female die contacts the base strip and stops while the male die continues on against springs 15 and stamps out the circuit pattern from conductive material 9 through female die 8. The male die extensions are advantageously made long enough so that the preformed circuit pattern is pressed onto the base material. Upon separation of the anvils, the spring loaded stripper 7 clears the conductive material waste from about the male die extensions, thereby preparing the press for another operation.

As illustrated in Fig. 1, the conductive material 9 is rolled copper foil supplied to the press from roll 16. Strip adhesive 30 is supplied to the copper foil from roll 18. Rolls 17 and 19 conserve the waste copper foil and adhesive salvage after the sheets have traveled through the press.

Advantageously heat-curing adhesive is used for a stronger bond. The heating coils in the male die are then used to heat the transferred copper foil causing the heat-curing adhesive to adhere to the base material when pressed against it by the male die.

The base material and adhered pattern are then removed from the die-blanking press and moved forward to the punching press 34 and the punching step. The punching press is illustrated in detail in Figs. 2 and 3. For convenience, the punching press 34 uses the same anvils 2 and 3 as does the die-blanking press 1. The punching press includes a male die 31 having a rubber stripper 32 about its male punches. The female die 33 is provided with holes which mate with the male punches. The female die also has indexing pins 20. The male punching die is provided with a steel rule die 21 shaped to the desired printed circuit boundary size. A compound blanking and piercing die may be used in place of the steel rule die 21, when harder base materials are used.

In the punching operation, the pattern base combination is moved forward to the punching press and is positioned so that the indexing holes 14 come into registry with the indexing pins 20. The anvils 2 and 3 are then pressed together and mounting holes 27 are punched through the conductive or resistive pattern and base material by the male punches. The punched out waste material is cleared through the holes in the female die which extend through anvil 3. The steel rule die partially blanks out the preform outline of the printed circuit. The anvils are then separated and the rubber stripper which is compressed in the closed anvil position expands and strips the male punches clear of the pattern base combination. The punches may of course be shaped to any desired configuration commensurate with the punching operation.

In the final operation, preform size pattern base combinations are removed from the base material strip and inserted into a mold. The molding step is influenced by the base material and is not necessary or desirable when a finished, cured base material is used. If a resinous uncured base material is used, it being understood that the process is not limited to the molding of this material, molding is best effected by a combination of pressure and heat. During pressure heat molding, however, there is a considerable amount of resin flow so that pre-punched holes will fill with resin during the molding step. To maintain accurate mounting hole diameters in the finished base, the mold should therefore be provided with sizing pins about which the resin can flow.

Figure 4:
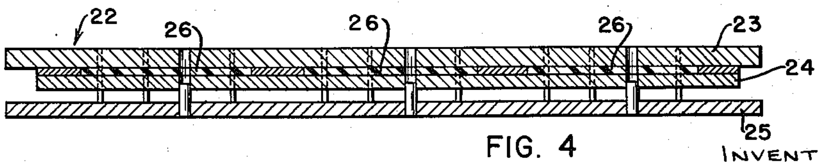
Fig. 4 is an elevation view of the pressure heat mold used in the manufacturing process taken along a line which passes through the die-blanked printed circuit at the same position as does line 3—3 of Fig. 2.

Mold 22 illustrated in Figs. 1 and 4 is adapted for the pressure heat molding of resinous base material. It comprises a drilled top plate 23, a built-up drilled bottom plate 24, and a sizing pin bearing release plate 25. The preforms 26 are inserted into the mold between plates 23 and 24. The sizing pins in plate 25 and the holes in plates 23 and 24 are positioned so as to mate and in registry with the mounting holes in preforms 26.

In the operation of the mold, plate 25 is brought into contact with plate 24. Pressure and heat are applied and the resin flows primarily in a direction perpendicular to the base surfaces. The phenolic resin cures during the molding cycle into a non-porous surface coating which covers the base material and mounting holes. The heat will also increase the strength of the heat-curing adhesive bond. After the molding cycle is completed, pin bearing plate 25 is pulled out of the finished product, plates 23 and 24 are separated and the finished product is removed.

It is evident that the mold may easily be formed to give many desired three-dimensional effects. For example, the mounting holes may be raised for selective soldering, or the base material may be stepped.

It is apparent that the latter two steps are optional and are not necessarily used in the manufacture of articles not requiring these steps, such as when applying patterns on wooden or plastic base materials for decorative purposes.

The described process for the manufacture of die-blanked printed circuits, forms and handles the circuit pattern and its application to the base material in a simple, economical manner. It is possible to make printed circuits by our method using only unskilled labor. The optional molding step which is longest in duration may be separated from the prior steps so that it will not interfere with the speed of manufacturing the preform size pattern and base combinations. In addition, the separation of the molding step permits the use of a simple mold, a relatively large number of which can be ganged in a laminating press thereby speeding up the molding process.

The described process has the advantage of forming and applying the circuit pattern to the base material without immersing the base material into either aqueous, alkaline or acidic solutions. In addition, if the molding step is used, no forming steps, such as drilling or cutting to size, are required after molding, so that none of the surface coating will be removed from the finished product.

While we have described our invention and a specific embodiment thereof, it is apparent that various changes and modifications may be made within the scope of the invention as set forth in the appended claims.

We claim:

1. The method of making printed circuit units, comprising the steps of; supporting a sheet of moldable insulating base material at a fixed station, supporting a sheet of conductive material spaced above said sheet of base material, by applying pressure to the lower surface thereof over areas bounding a predetermined circuit pattern leaving said pattern area unsupported, applying pressure to the unsupported pattern areas at the upper surface of said sheet of conducting material to shear said pattern from said sheet, guiding said sheared pattern toward the upper surface of said base sheet while continuing to apply said pressure to said pattern area to thereby uninterruptedly push said sheared pattern onto the upper surface of said base sheet, and providing an adhesive between said pattern area and said base sheet whereby said pressure serves to adhere said sheared pattern to said base sheet.

2. The method set forth in claim 1 wherein said base base material is of an uncured resin material, and including the further step of curing said base material with said pattern thereon.

3. The method set forth in claim 1 including the further steps of; indexing said base material and pattern to a second station and punching mounting holes through said base material.

4. The method set forth in claim 1 wherein the adhesive is in the form of a sheet and including the step of interposing the adhesive sheet between the sheet of conductive material and the sheet of base material, and wherein the adhesive material is sheared in the same pattern as the conductive material by the pressure applied to the unsupported area of the conductive material.

5. The method set forth in claim 1 wherein said base material is in the form of an elongated strip and including the further steps of; punching indexing holes in said base, at said fixed station, adjacent said pattern, advancing said strip to position said pattern at at least one other station, using said index holes to accurately position said pattern at said other station, and performing further punching operations on said base material at said other station.

6. The method set forth in claim 5 wherein said further punching operation includes severing a predetermined area, containing said pattern, from said strip.

7. The method set forth in claim 6, including the further step of molding said severed area to a predetermined size and shape and curing the material thereof.

References Cited in the file of this patent

UNITED STATES PATENTS

| | | |
|---|---|---|
| 1,794,831 | Caruso | Mar. 3, 1931 |
| 2,302,094 | Bacon | Nov. 17, 1942 |
| 2,343,205 | Pudelko | Feb. 29, 1944 |
| 2,457,616 | Van Dyke et al. | Dec. 28, 1948 |
| 2,535,674 | Franklin | Dec. 26, 1950 |
| 2,543,384 | Squier | Feb. 27, 1951 |
| 2,610,390 | Locke | Sept. 16, 1952 |
| 2,753,619 | Franklin | July 10, 1956 |

OTHER REFERENCES

Webster's International Dictionary of the English Language, Second edition. G. C. Merriam Co., Springfield, March 1938, p. 283.

Materials and Methods, vol. 33, issue 4, pp. 78–81, published April 1951.